United States Patent
Matsumoto

(10) Patent No.: US 11,737,235 B2
(45) Date of Patent: Aug. 22, 2023

(54) PROPULSION CONTROL DEVICE

(71) Applicant: Mitsubishi Electric Corporation, Tokyo (JP)

(72) Inventor: Yuta Matsumoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 777 days.

(21) Appl. No.: 16/484,942

(22) PCT Filed: Mar. 29, 2017

(86) PCT No.: PCT/JP2017/012934
§ 371 (c)(1),
(2) Date: Aug. 9, 2019

(87) PCT Pub. No.: WO2018/179143
PCT Pub. Date: Oct. 4, 2018

(65) Prior Publication Data
US 2020/0015382 A1    Jan. 9, 2020

(51) Int. Cl.
*H05K 7/20* (2006.01)
*B61C 17/00* (2006.01)

(52) U.S. Cl.
CPC ..... *H05K 7/20145* (2013.01); *H05K 7/20172* (2013.01); *H05K 7/20863* (2013.01); *H05K 7/20909* (2013.01); *B61C 17/00* (2013.01)

(58) Field of Classification Search
CPC .......... H05K 7/20145; H05K 7/20172; H05K 7/206; H05K 7/20; H05K 7/20136;
(Continued)

(56) References Cited

U.S. PATENT DOCUMENTS 4,758,924 A * 7/1988 Dillon ............... H05K 7/20554
361/752
7,120,018 B2 * 10/2006 Shen ..................... G06F 1/20
174/16.3
(Continued)

FOREIGN PATENT DOCUMENTS

JP     H045898 A    1/1992
JP     H05160311 A    6/1993
(Continued)

OTHER PUBLICATIONS

Office Action dated Sep. 16, 2020, issued in corresponding Indian Patent Application No. 201927029947, 5 pages.
(Continued)

*Primary Examiner* — Steven B McAllister
*Assistant Examiner* — Cole N Friedman
(74) *Attorney, Agent, or Firm* — Buchanan Ingersoll & Rooney PC

(57) ABSTRACT

A propulsion control device of the present disclosure includes: a housing; a gate controller disposed at one end side of an interior space of the housing in a longitudinal axis direction X, the gate controller being configured to control a power converter; a fan disposed under the gate controller, the fan being configured to feed air to the gate controller; and an airflow guide member disposed at the side opposite to the fan relative to the gate controller, having, on an interior face of a ceiling of the housing, an airflow guide face having a predetermined angle with respect to the vertical direction, the airflow guide member being configured to guide air passed through the gate controller to flow toward the other end side of the interior space of the housing in the longitudinal axis direction X.

14 Claims, 15 Drawing Sheets

(58) Field of Classification Search
CPC ............... H05K 7/20181; H05K 7/202; H05K 7/20718; H05K 7/20754; H05K 7/20727; H05K 5/0069; H05K 7/1491; H01L 23/467; H01L 23/46; H01L 23/367; B60H 1/3414; B60H 1/345; B60H 2001/00092; G06F 1/20; G06F 1/206; F24F 13/081; F24F 1/24; F24F 2013/088; F24F 13/08; F24F 13/082; B61C 17/00; F15D 1/0005; F15D 1/04; G11B 33/142
USPC ............... 361/695, 679.51, 679.49; 257/721, 257/E23.099; 454/184, 365; 165/104.33
See application file for complete search history.

(56) References Cited

U.S. PATENT DOCUMENTS

| | | | | |
|---|---|---|---|---|
| 7,277,281 | B1* | 10/2007 | Lu ........................ | H01L 23/467 415/213.1 |
| 8,159,820 | B2* | 4/2012 | Ibori .................... | H02M 7/003 312/223.1 |
| 8,840,453 | B2* | 9/2014 | Izuno ................. | H05K 7/20727 361/679.46 |
| 9,320,158 | B2 | 4/2016 | Ikemoto | |
| 2011/0317359 | A1* | 12/2011 | Wei ....................... | F15D 1/0005 361/690 |
| 2012/0033379 | A1* | 2/2012 | Lam ................... | H05K 7/20572 361/695 |
| 2013/0047658 | A1* | 2/2013 | Lennon ................. | A47F 3/0413 220/592.02 |
| 2014/0117977 | A1 | 5/2014 | Celidonia et al. | |
| 2015/0077935 | A1* | 3/2015 | Wright ................. | H05K 7/1491 248/65 |
| 2016/0282065 | A1* | 9/2016 | Mitsui ................... | H01L 23/467 |
| 2018/0252221 | A1* | 9/2018 | Yamasaki ........... | F04D 25/0693 |

FOREIGN PATENT DOCUMENTS

| | | | |
|---|---|---|---|
| JP | H07221477 | A | 8/1995 |
| JP | H08271104 | A | 10/1996 |
| JP | H09008485 | A | 1/1997 |
| JP | H10212949 | A | 8/1998 |
| JP | 2012059741 | A * | 3/2012 |
| JP | 2013093487 | A | 5/2013 |
| JP | 2013154758 | A | 8/2013 |
| JP | 2013166501 | A | 8/2013 |

OTHER PUBLICATIONS

International Search Report (PCT/ISA/210) dated Jun. 13, 2017, by the Japan Patent Office as the International Searching Authority for International Application No. PCT/EP2017/012934.

Written Opinion (PCT/ISA/237) dated Jun. 13, 2017, by the Japan Patent Office as the International Searching Authority for International Application No. PCT/EP2017/012934.

Office Action dated Apr. 21, 2021, issued for corresponding DE Patent Application No. 112017007352.9, 11 pages including 5 pages of English translation.

* cited by examiner

PROPULSION CONTROL DEVICE

TECHNICAL FIELD

The present disclosure relates to propulsion control device to be mounted on a railway vehicle.

BACKGROUND ART

A conventional vehicular semiconductor controller uses cooling air to cool a gate drive unit outputting a signal that turns on and off semiconductor elements contained in a housing and used for power conversion (for example, see Patent Literature 1).

CITATION LIST

Patent Literature

Patent Literature 1: Unexamined Japanese Patent Application Kokai Publication No. H10-212949

SUMMARY OF INVENTION

Technical Problem

However, the vehicular semiconductor controller of Patent Literature 1 has a complex structure due to being equipped with a cooling fan that intakes cooling air passed through the gate drive unit, an airflow guide plate down which the cooling air discharged from the cooling fan flows, and an airflow-straightening plate to cause air to flow from a lower end of the airflow guide plate to below the gate drive unit.

In order to solve such problems, an objective of the present disclosure is to provide, by a structure simpler than structures heretofore, a propulsion control device capable of causing cooling airflow passed through the gate controller to circulate within the housing.

Solution to Problem

In order to attain the aforementioned objective, a propulsion control device according to the present disclosure includes:

a housing;

a gate controller disposed at one end side of an interior space of the housing in a longitudinal axis direction, the gate controller being configured to control a power converter;

a fan disposed below the gate controller, the fan being configured to feed air to the gate controller;

an airflow guide member positioned relative to the gate controller at the side opposite to that of the fan, and having, on an interior face of a ceiling of the housing, an airflow guide face having a predetermined angle with respect to the vertical direction, the airflow guide member to guide air passed through the gate controller flow toward the other end side of the interior space of the housing in the longitudinal axis direction.

Advantageous Effects of Invention

According to the propulsion control device of the present disclosure, the airflow guide member is provided that guides the air passed through the gate controller disposed at the one end side of the interior space of the housing in the longitudinal axis direction such that the air flows toward the other end side of the interior space of the housing in the longitudinal axis direction, and thus, by a simple structure, causes the air passed through the gate controller to circulate within the housing.

DESCRIPTION OF EMBODIMENTS

Embodiments of a propulsion control device according to the present disclosure are described below with reference to drawings.

Embodiment 1

Figure 1:
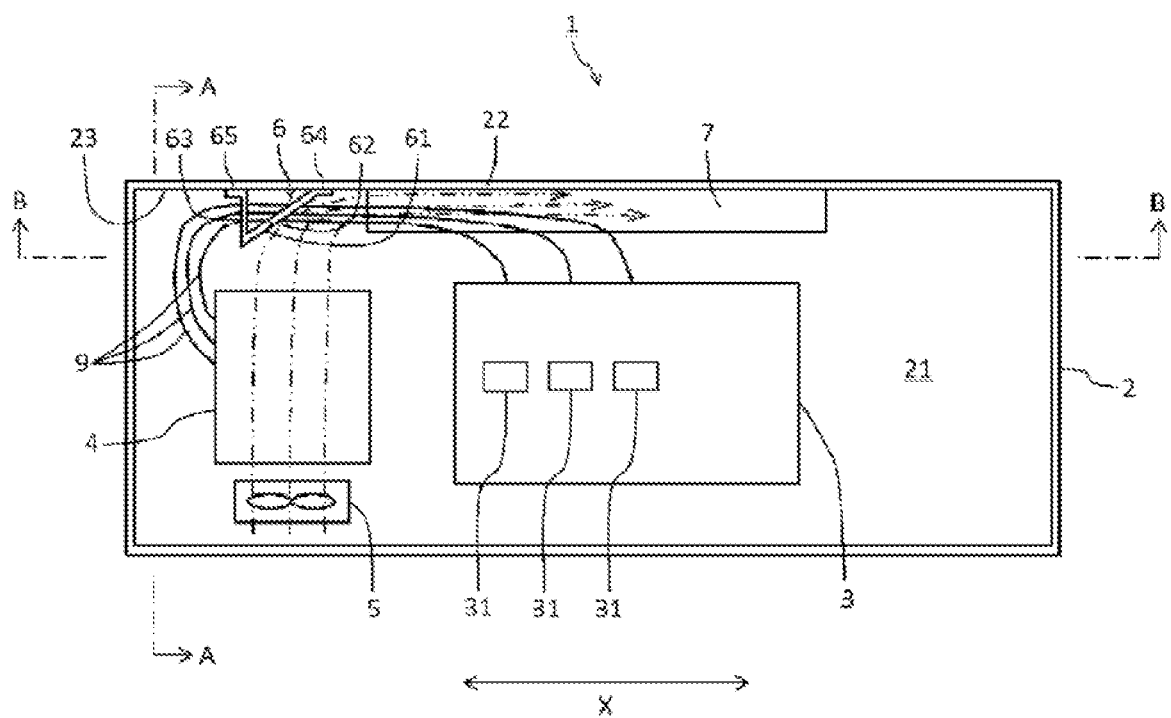
FIG. 1 is cross-sectional view illustrating an example of configuration of an interior of a propulsion control device according to Embodiment 1 of the present disclosure.

FIG. 1 is a cross-sectional view illustrating an example of configuration of an interior of a propulsion control device 1 according to Embodiment 1. The propulsion control device 1 is mounted, for example, below the floor or on the roof of a railway vehicle. As illustrated in FIG. 1, the propulsion control device 1 includes: a housing 2 to be attached to a railway vehicle (not illustrated); a gate controller 4 disposed at one end side in a longitudinal axis direction (vehicle-lateral direction of the railway vehicle) X of an interior space 21 of the housing 2 and to control a power converter 3; a fan 5 to feed air to the gate controller 4; an airflow guide member 6 to guide air passed through the gate controller 4 to flow toward the other end side in the longitudinal axis direction X; and airflow straightening components 7 to cause air directed to flow through the airflow guide member 6 toward a side opposite to the other end side in the longitudinal axis direction X (that is, in the interior space 21 of the housing 2, to the side opposite to the one end side where the gate controller 4 is arranged). Further, although the longitudinal axis direction X in the interior space 21 of the housing 2 in the present embodiment is taken to be the vehicle-lateral direction of the railway vehicle, this configuration is not limiting, and this direction is set appropriately in accordance with shape of the housing 2 and/or the method of attachment thereof to the railway vehicle; this direction may be the travel direction of the railway vehicle; and this direction is a direction in which a long horizontal direction dimension is formed in the interior space 21 of the housing 2.

Figure 2:
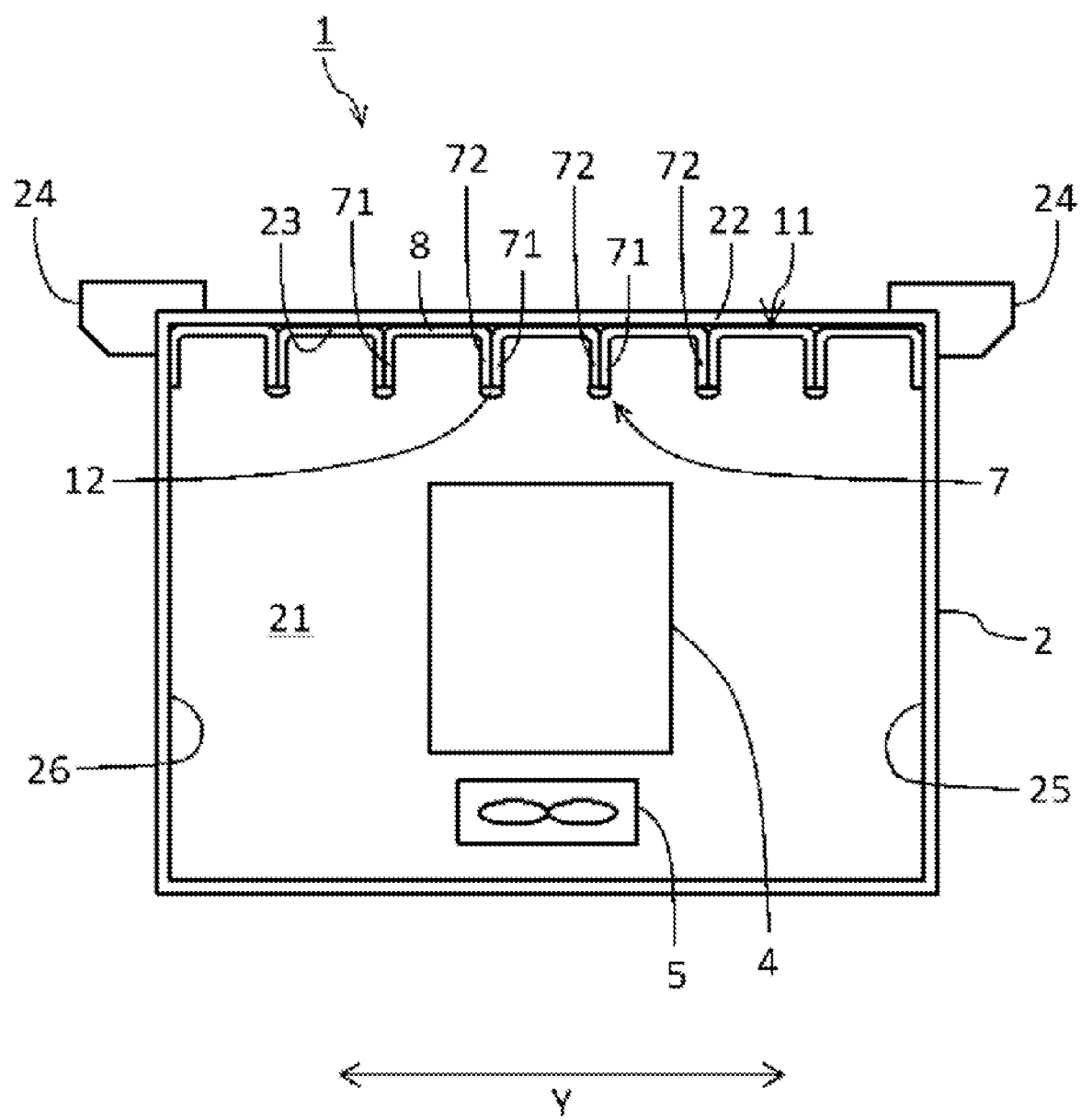
FIG. 2 is a cross-sectional view illustrating an example of configuration of the interior of the propulsion control device according to Embodiment 1 of the present disclosure.

The housing 2, for example, is attached below the floor or on the roof of the railway vehicle. Furthermore, in the present embodiment, an example is described in which the housing 2 is attached below the floor of the railway vehicle. FIG. 2 is a cross-sectional view taken along line A-A in FIG. 1, and an arrow Y in FIG. 2 indicates the travel direction of the railway vehicle. For ease of description, components such as the airflow guide member 6 are omitted from FIG. 2. The housing 2 is provided with multiple hanging jigs 24 for attachment by hanging from the floor of the railway vehicle as illustrated in FIG. 2. The housing 2, for example, is formed in an approximately rectangular solid shape and has an interior space 21, and the interior space 21 contains devices such as the gate controller 4, the power converter 3 to be controlled by the gate controller 4. The housing 2 may be constructed using materials such as relatively lightweight aluminum, highly corrosion-resistant stainless steel plate. Moreover, the housing 2, although not illustrated in detail, has a suitably formed opening part for performing operations such as maintenance of the devices to be contained in the interior space 21, and a cover is attached to this opening part to maintain a water-tight state. Moreover, the shape of the housing 2 is not limited to the shape in the present embodiment, and any shape may be used that has a space capable of containing the gate controller 4, the power converter 3, or the like.

As illustrated in FIG. 1, the power converter 3 is disposed at the other end side in the longitudinal axis direction X in the interior space 21 of the housing 2 relative to the gate controller 4. The power converter 3, for example, receives power from an overhead line for running the railway vehicle and generates power necessary for driving the vehicle. The power converter 3 has multiple switching elements 31 that perform switching for generation of the driving power, and ON/OFF operation thereof is controlled by the gate controller 4. For example, a wide bandgap semiconductor having a large bandgap in comparison to silicon is used as the switching element 31. A SiC semiconductor, for example, may be used appropriately as the wide bandgap semiconductor. Switching can be performed at high speed due to use of the switching element 31 formed from SiC semiconductor. Heat resistance improves due to use of a SiC semiconductor for the switching element, and thus the SiC semiconductor is used with advantage in a configuration in which hot air passed through the gate controller 4 flows through the airflow guide member 6 as in the propulsion control device 1 of the present embodiment. Moreover, the SiC semiconductor is an example of a semiconductor termed a "wide bandgap semiconductor"; in addition to the SiC semiconductor, other semiconductors are members of the wide bandgap semiconductors, such as semiconductors formed using gallium nitride type materials or diamond; and such semiconductors may be used. Moreover, the switching element 31 is not limited to a wide bandgap semiconductor, and a previously known semiconductor element may be used such as an insulated gate bipolar transistor (IGBT) formed from silicon or silicon nitride. Moreover, although the power converter 3 in the present embodiment is disposed at a position at the other end side in the longitudinal axis direction X relative to the gate controller 4, the position of disposal of the power converter 3 is not limited to that of the present embodiment, and another device or the like may be disposed at the position of arrangement of the power converter 3.

As illustrated in FIG. 1, the gate controller 4 is disposed at the one end side (left side in FIG. 1) in the longitudinal axis direction X of the interior space 21 of the housing 2. The gate controller 4 controls ON/OFF operation of the switching elements 31 of the power converter 3 and controls power converter operation. Moreover, although in the present embodiment, an example is illustrated of arrangement of the gate controller 4 in which the left side in FIG. 1 is taken to be the one end side in the longitudinal axis direction X, the gate controller 4 may be disposed at the right side in FIG. 1 as the one end side in the longitudinal axis direction X.

Although not illustrated in detail, the gate controller 4 includes multiple control boards having circuits for controlling operation of the switching elements 31. Wires 9 corresponding to each of these control boards are connected to the gate controller 4. As illustrated in FIG. 1, the wires 9 are led, from the gate controller 4 toward the airflow guide member 6, to the side opposite to the direction of flow of air and toward a ceiling 22 side, the air passed through the gate controller 4 being guided by the airflow guide member 6. That is to say, the multiple wires 9 are led to the one end side in the longitudinal axis direction X from the gate controller 4. Moreover, the multiple wires 9 each connect to the corresponding switching elements 31 of the power converter 3 through below-described support holes 66 and 67 of the airflow guide member 6. Moreover, the double-dot dashed lines in FIG. 1 indicate an example of flow of air fed from the fan 5 to the airflow straightening components 7 passed through the gate controller 4 and the airflow guide member 6.

As illustrated in FIG. 1, the fan 5 is disposed at a position under the gate controller 4. The fan 5 feeds air to the gate controller 4 in order to cool the gate controller 4. The air fed from the fan 5 to the gate controller 4 and warmed through the gate controller 4 passes through the gate controller 4, and thereafter is guided to flow toward the other end side in the longitudinal axis direction X by the airflow guide member 6 disposed at an interior face 23 of the ceiling 22 positioned above the gate controller 4.

As illustrated in FIG. 1, the airflow guide member 6 is positioned relative to the gate controller 4 at the side opposite to that of the fan 5, and is arranged at the interior face 23 of the ceiling 22 of the housing 2. The airflow guide member 6 guides the air passed through the gate controller 4 so as to flow toward the other end side in the longitudinal axis direction X of the interior space 21 of the housing 2.

Figure 3:
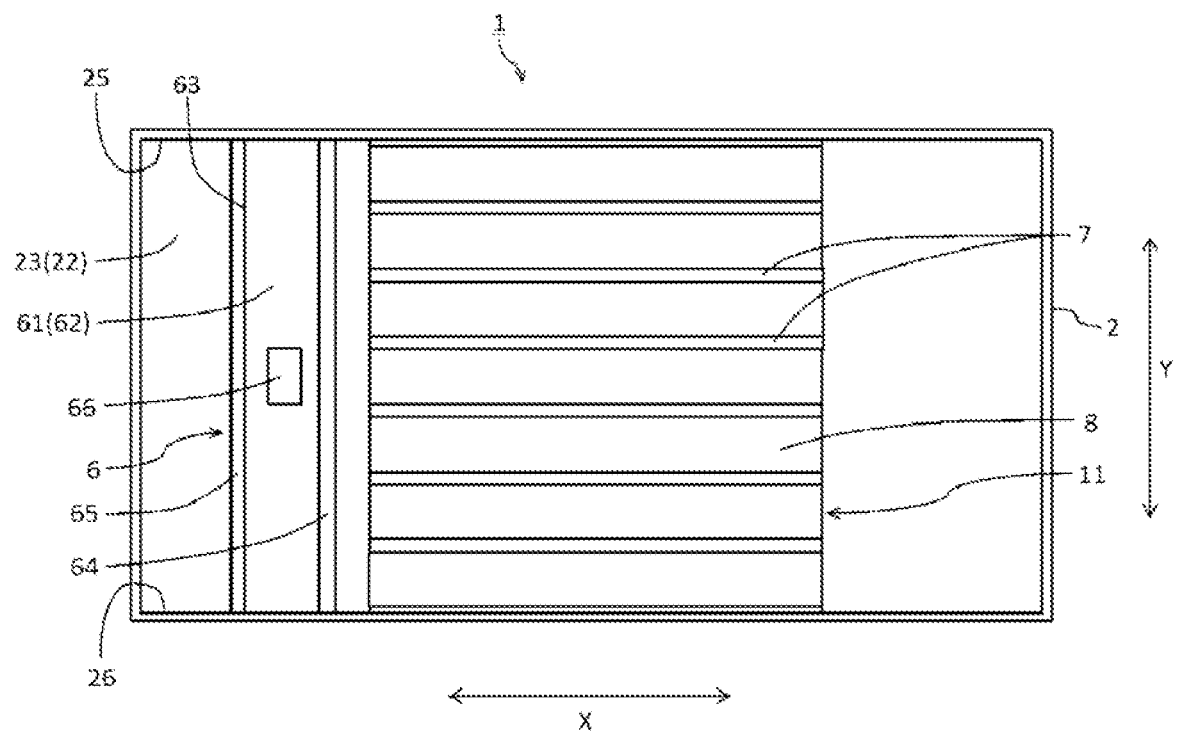
FIG. 3 is a cross-sectional view illustrating an example of configuration of the interior face of a ceiling of a housing of the propulsion control device according to Embodiment 1 of the present disclosure.
Figure 4:
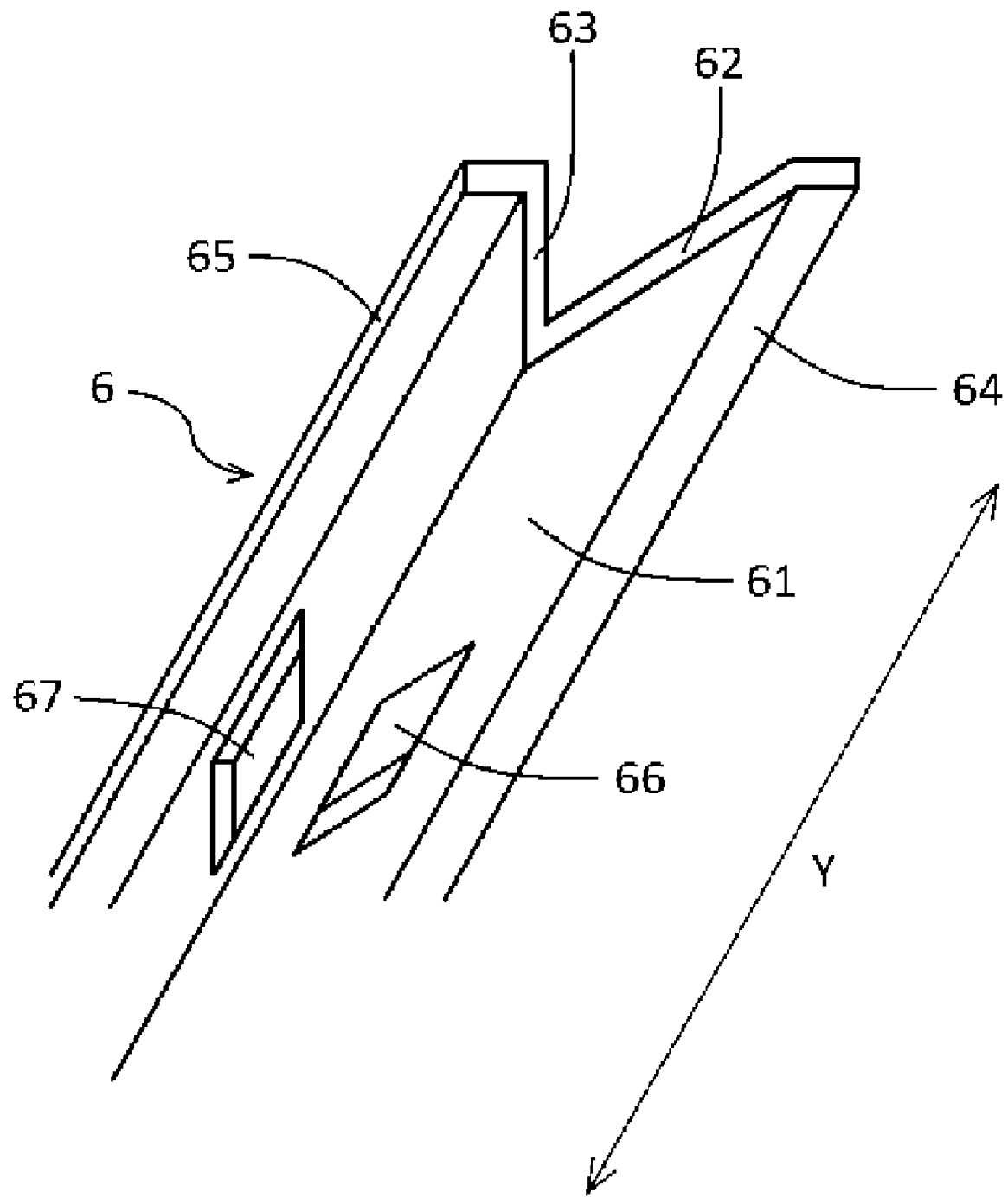
FIG. 4 is a perspective view illustrating an example of an airflow guide member of the propulsion control device according to Embodiment 1 of the present disclosure.

FIG. 3 is a cross-sectional view taken along line B-B in FIG. 1; an arrow X in FIG. 3 indicates the vehicle-lateral direction of the railway vehicle, and an arrow Y indicates the travel direction of the railway vehicle. For ease of description, the multiple wires 9 led from the gate controller 4 are omitted from FIG.3. As illustrated in FIGS. 3 and 4, the airflow guide member 6 is formed extending in the travel direction of the railway vehicle, that is in the travel direction Y that is the direction orthogonal to the longitudinal axis direction X within the horizontal plane; and both ends of the travel direction Y of the airflow guide member 6 are fixed to side faces 25 and 26 parallel to the longitudinal axis direction X of the housing 2. As illustrated in FIGS. 1 and 4, the airflow guide member 6 is formed as a reinforcing beam of the ceiling 22 and includes: a plate-like first member 62 having the airflow guide face 61; and a second member 63 extending toward the interior face of the ceiling 22 and continuing from the end portion of the first member 62 opposite to a side abutting against the ceiling 22.

At an end part of the side of the first member 62 abutting against the ceiling 22, a first fixing part 64 is formed for fixing the airflow guide member 6 to the ceiling 22. The first fixing part 64 is formed by bending from the end part of the side of the first member 62 abutting against the ceiling 22 toward the other end side in the longitudinal axis direction X, and although not illustrated in detail, is fixed to the ceiling 22 by means such as welding or fixing members such as bolts. Moreover, also at an end part of the side of the second member 63 abutting against the ceiling 22, a second fixing part 65 is formed for fixing the airflow guide member 6 to the ceiling 22. The second fixing part 65 is formed by bending from the end part of the side of the second member 63 abutting against the ceiling 22 toward the one end side in the longitudinal axis direction X, and although not illustrated in detail, is fixed to the ceiling 22 by means such as welding or fixing members such as bolts.

Figure 5:
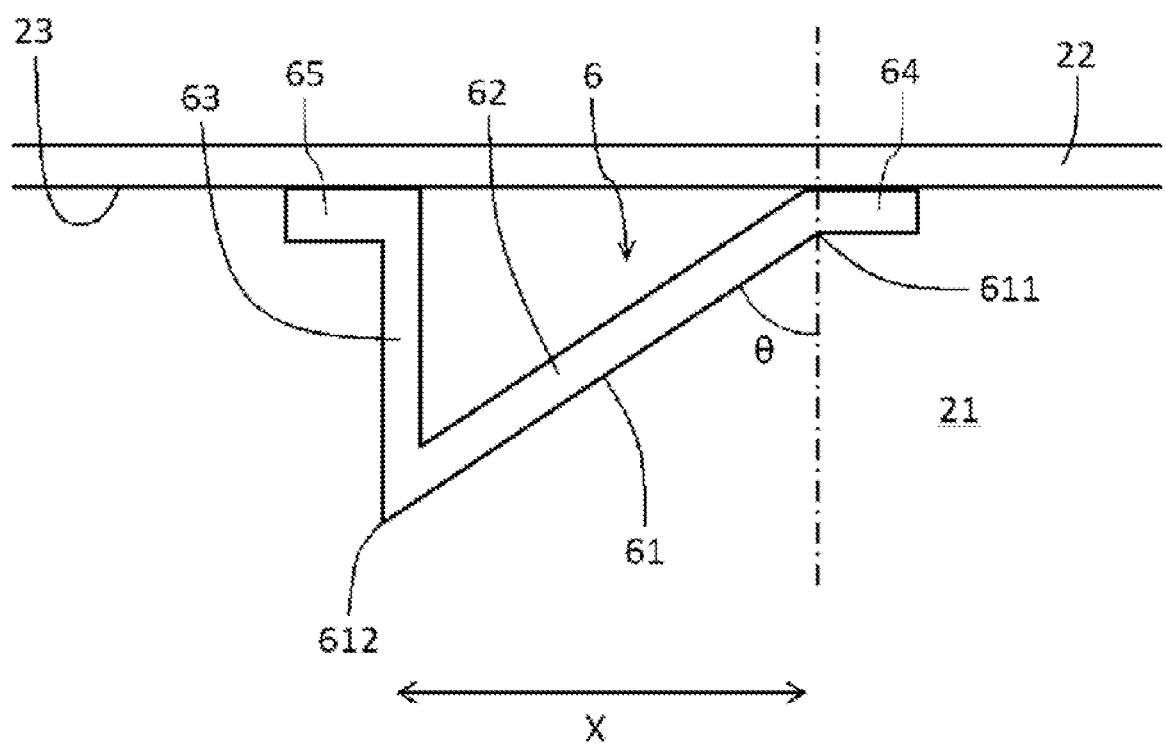
FIG. 5 is a magnified view illustrating an example of a state in which the airflow guide member of the propulsion control device according to Embodiment 1 of the present disclosure is fixed to the ceiling.
Figure 6:
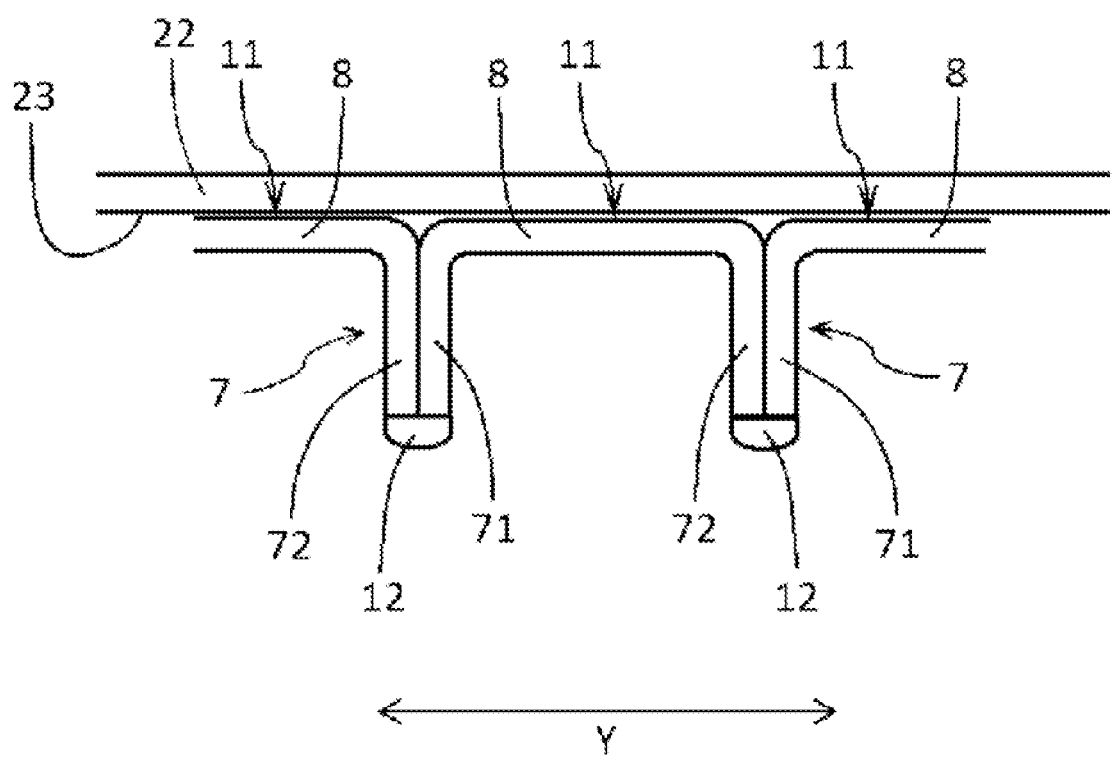
FIG. 6 is a magnified view illustrating an example of an edge-connection structure of an airflow straightening component of the propulsion control device according to Embodiment 1 of the present disclosure.

As illustrated in FIGS. 1 and 5, the airflow guide face 61 is formed so as to have a predetermined angle θ relative to the vertical direction indicated by the dot-dashed line within FIG. 5, in order to cause the air passed through the gate controller 4 to flow toward the other end side in the longitudinal axis direction X of the interior space 21 of the housing 2. The airflow guide face 61 includes a base-end portion 611 positioned at the side near the ceiling 22 and a tip portion 612 positioned at the side apart from the ceiling 22. The predetermined angle θ is set at an angle tilted such that the tip portion 612 is positioned further toward the one end side in the longitudinal axis direction X than the base-end portion 611 relative to the vertical direction. Moreover, no particular limitation is placed on the predetermined angle θ of the airflow guide face 61 as long as the angle is set such that the air passed through the gate controller 4 flows toward the other end side in the longitudinal axis direction X of the interior space 21 of the housing 2, although this angle is preferably set in a range of, for example, 30° to 60° such that more air efficiently flows toward the other end side in the longitudinal axis direction X. Moreover, as illustrated in FIG. 3, the airflow guide face 61 is formed as a surface positioned at the bottom side of the first member 62.

As illustrated in FIG. 4, the first member 62 and the second member 63 of the airflow guide member 6 has support holes 66 and 67 supporting the wires 9 led from the gate controller 4 with the wires 9 inserted through the support holes 66 and 67, respectively. The support holes 66 and 67, for example, are formed by forming square-shaped cutouts in the first member 62 and the second member 63, respectively. Moreover, the shapes and sizes of the support holes 66 and 67 are not limited to those of the present embodiment, and such shapes and sizes may be set appropriately in accordance with the number and/or types of the wires 9 passing through the support holes 66 and 67, and preferably are formed so as to hardly cause formation of a gap between the wires 9 and inner peripheral surfaces of the support holes 66 and 67 when the multiple wires 9 pass therethrough. Moreover, in the case in which a gap arises between the wires 9 and the inner peripheral surfaces of the support holes 66 and 67 when the wires 9 pass through the support holes 66 and 67, an auxiliary member for filling the gap can be attached to each of the first member 62 and the second member 63. Moreover, in the case in which the support holes 66 and 67 are not formed in the airflow guide member 6, the wires 9 may be arranged along the surface of the airflow guide member 6.

As illustrated in FIGS. 1 to 3, the airflow straightening component 7 is arranged at a position closer to the other end side of the interior face 23 of the ceiling 22 in the longitudinal axis direction X than the airflow guide member 6. The airflow straightening component 7 causes the air flowing through the gate controller 4 and the airflow guide member 6 to flow further toward the other end side in the longitudinal axis direction X. The airflow straightening components 7 are formed extending in the longitudinal axis direction X, and are arranged to project downward from the ceiling 22. As illustrated in FIGS. 2 and 3, the airflow straightening components 7 are arranged side-by-side so as to be parallel to the longitudinal axis direction X.

In the present embodiment, as illustrated in FIG. 2, multiple frame members 11 each formed with a U-shaped cross section are fixed to the interior face 23 of the ceiling 22. The frame members 11 are elongated in the longitudinal axis direction X and have: pairs of airflow straightening members 71 and 72 that project downward from the ceiling 22 and are spaced apart in the travel direction Y, and coupling members 8 that each interconnects the end parts of a pair of the airflow straightening members 71 and 72 at the ceiling 22 side. Such frame members 11 are disposed side-by-side, mutually adjacent to each other, and parallel to the longitudinal axis direction X; and the airflow straightening member 72 and the airflow straightening member 71 of mutually-adjacent frame members 11 abut against each other and overlap in the thickness direction. Among the frame members 11, the airflow straightening member 71 or 72 of the frame members 11 positioned at both end sides of the travel direction Y is fixed to a side face 25 or 26 of the housing 2. Moreover, the coupling member 8 of each of the frame members 11 is fixed to the interior face 23 of the ceiling 22 by means such as welding or fixing members such as bolts.

In the present embodiment, the airflow straightening component 7, as illustrated in FIGS. 2 and 5, includes the adjacent airflow straightening members 71 and 72 of the frame member 11, the airflow straightening member 71 and the airflow straightening member 72 being overlapped with each other in the thickness direction (travel direction Y). The adjacent airflow straightening member 71 and airflow straightening member 72 forming the airflow straightening component 7, as illustrated in FIG. 5, are formed by an edge-connection structure having a connecting part 12 edge welded over the entire elongated direction of the tip portion of the respective airflow straightening member 71 and the airflow straightening member 72. Moreover, although no particular limit is placed on the longitudinal axis direction X length of the airflow straightening component 7, in order to allow efficient circulation of air in the interior space 21 of the housing 2, the end portions at the other end side in the longitudinal axis direction X are preferably formed so as to be positioned closer to the other end side than the center of the housing 2 in the longitudinal axis direction X. Moreover, the end part of the airflow straightening component 7 arranged at the one end side in the longitudinal axis direction X, in order to enable flow of the air guided by the airflow guide member 6 efficiently toward the other end side in the longitudinal axis direction X, is preferably arranged in the vicinity of the airflow guide member 6, is positioned to the longitudinal direction other end side more than the airflow guide member 6, and is arranged at a position closer to the one end side than the center of the longitudinal axis direction X. Moreover, although not illustrated in detail, the air circulated in the interior of the housing 2 by the airflow straightening component 7 causing flow toward the other end side in the longitudinal axis direction X may be further circulated in the interior of the housing 2 by an appropriated arranged non-illustrated fan.

According to the propulsion control device 1 according to Embodiment 1 of the present disclosure includes: the housing 2; the gate controller 4 that is disposed in the interior space 21 of the housing 2 at the one end side in the longitudinal axis direction X and controls the power converter 3; the fan 5 that is positioned under the gate controller 4 and feeds air toward the gate controller 4; and the airflow guide member 6 positioned relative to the gate controller 4 at the side opposite to that of the fan 5, arranged at the interior face 23 of the ceiling 22 of the housing 2, having the airflow guide face 61 set at a predetermined angle θ relative to the vertical direction, and guiding the air passed through the gate controller 4 so as to flow toward the other end side in the longitudinal axis direction X of the interior space 21 of the housing 2; and thus the air passed through the gate controller 4 can be made to circulate in the interior space 21 of the housing 2 by a simple structure. The propulsion control device 1 thus can uniform heat distribution of the interior space 21 of the housing 2. Moreover, in the propulsion control device used on the railway vehicle, temperature gradients within the housing are large, temperatures specifically at the upper portion of the interior of the housing are high, and temperatures at the lower portion are low in comparison to the upper portion. However, by use of the propulsion control device 1 of the present disclosure as the railway vehicle propulsion control device, the air passed through the gate controller 4 can be circulated in the interior space 21 of the housing 2, thereby enabling increase in the cooling effect of the overall propulsion control device 1.

Moreover, according to the propulsion control device 1 of Embodiment 1 of the present disclosure, the airflow guide face 61 of the airflow guide member 6 has the base-end portion 611 arranged at the side near the ceiling 22 and the front-end portion 612 positioned at the side apart from the ceiling 22. The predetermined angle θ is an angle that is tilted, relative to the vertical direction, such that the tip portion 612 is positioned closer to the one end side in the longitudinal axis direction X than the base-end portion 611; and thus the air passed through the gate controller 4 can be efficiently guided to the other end side in the longitudinal axis direction X of the interior space 21 of the housing 2.

Moreover, according to the propulsion control device 1 according to Embodiment 1 of the present disclosure, the airflow guide member 6 is the reinforcing beam that has the first member 62 having the airflow guide face 61, and the second member extending toward the interior face of the ceiling 22 and continuing from the end portion of the first member 62, the end portion being opposite to a side abutting against the ceiling 22, and thus the air passed through the gate controller 4 can be circulated in the interior of the housing 2, and strength of the housing 2 can be improved. Moreover, the cross section of the airflow guide member 6 included in the reinforcing beam has a hill-like shape formed from the first member 62 and the second member 63, and thus cross-sectional area can be reduced in comparison to the case of the cross section formed into a quadrangular shape, and weight can be reduced.

Moreover, the propulsion control device 1 according to Embodiment 1 of the present disclosure includes the airflow straightening component 7 arranged at the interior face 23 of the ceiling 22, closer to the other end side in the longitudinal axis direction X than the airflow guide member 6, and causes the air passed through the gate controller 4 and the airflow guide member 6 to flow closer to the other end side in the longitudinal axis direction X, and thus the air can be circulated more efficiently within the housing 2.

Moreover, according to the propulsion control device 1 of Embodiment 1 of the present disclosure, airflow straightening components 7 are arranged protruding downward from the ceiling 22, and thus the flowing air guided by the airflow guide member 6 can be circulated uniformly within the housing 2.

Moreover, according to the propulsion control device 1 according to Embodiment 1 of the present disclosure, the airflow straightening components 7 are arranged side-by-side and parallel to the longitudinal axis direction X; the airflow straightening components 7 include the airflow straightening members 71 and 72 arranged to protrude downward from the ceiling 22, the airflow straightening members 71 and 72 being overlapped with each other in the thickness direction of the airflow straightening components 7, coupling members 8 each connecting mutually adjacent a pair of airflow straightening members 71 and 72 with an interval therebetween are fixed to the interior face 23 of the ceiling 22, and thus the air can be circulated in the interior of the housing 2 with greater efficiency, and strength of the housing 2 can be improved.

Moreover, according to the propulsion control device 1 according to Embodiment 1 of the present disclosure, the adjacent airflow straightening members 71 and 72 forming the airflow straightening component 7 have the tip portions, the tip portions being welded together by edge-connection structure, and thus strength of the housing 2 can be further increased, and distortion during welding can be suppressed.

Moreover, the propulsion control device 1 according to Embodiment 1 of the present disclosure includes the multiple wires 9 led, toward the ceiling 22 side, from the gate controller 4 toward the airflow guide member 6, toward the side opposite of the direction of flow of air passed through the gate controller 4 caused by the airflow guide member 6, and thus the flow of air passed through the gate controller 4 can be suppressed from flowing into the side opposite to the flow guided by the airflow guide member 6.

Moreover, according to the propulsion control device 1 according to Embodiment 1 of the present disclosure, the airflow guide member 6 has the support holes 66 and 67 formed therein that support the wires 9 passing therethrough; there is no need for separately arranging components such as wire-fixing members or the like for supporting the wires 9; and thus space can be reduced, and interference of the wires 9 with the role of the airflow guide member 6 can be suppressed. Moreover, although not illustrated in detail, in the propulsion control device 1, the airflow guide member 6 has cutouts for fixing the wires, and by fixing of the wires 9 by these cutouts, space can be reduced without separately providing components such as wire-fixing members or the like.

Figure 7:
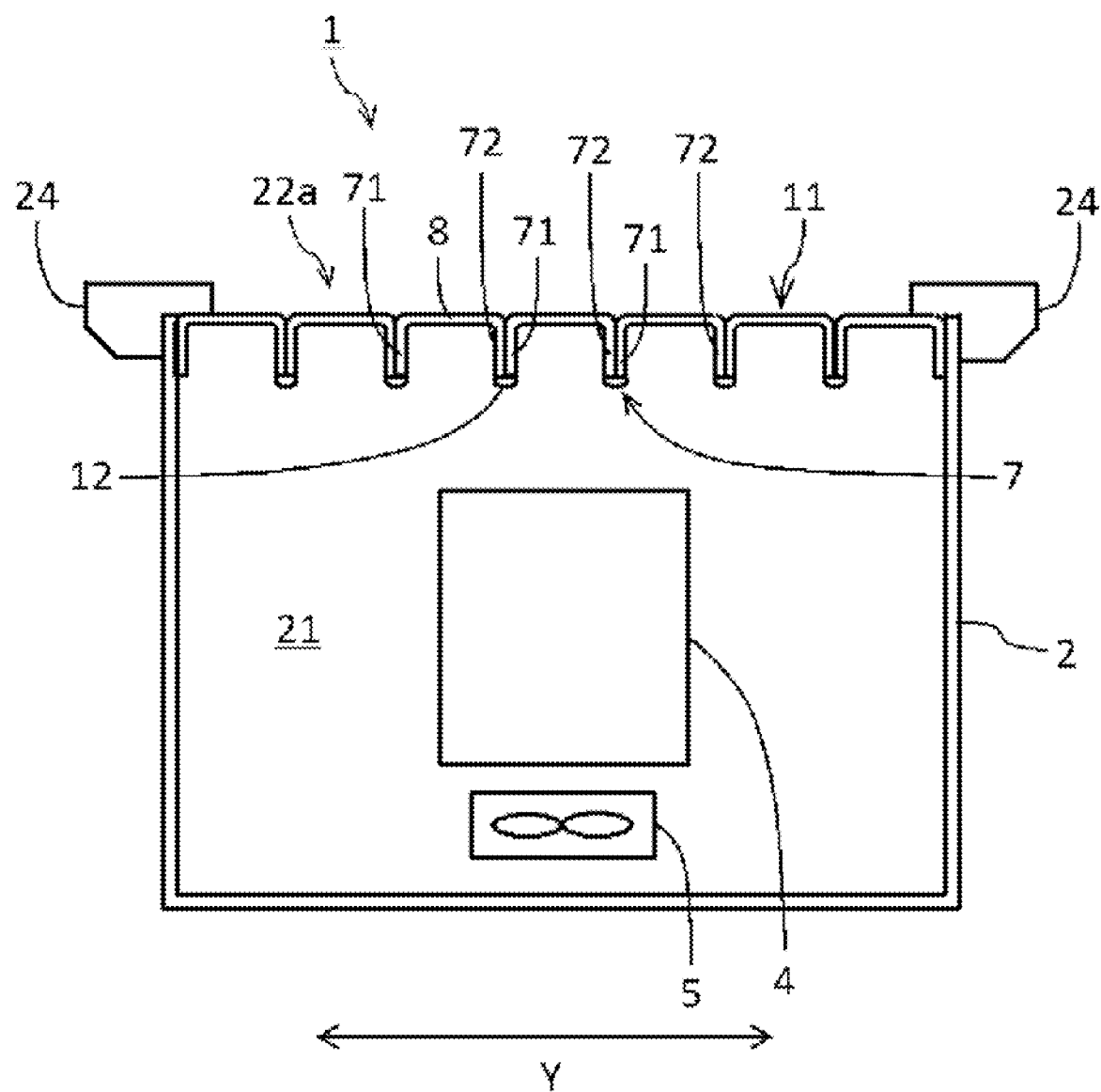
FIG. 7 is a cross-sectional view illustrating another example of configuration of the interior of the propulsion control device according to Embodiment 1 of the present disclosure.

Moreover, the structure of the ceiling of the housing 2 of the propulsion control device 1 according to Embodiment 1 of the present disclosure may be that of a ceiling 22a, as illustrated in FIG. 7 for example, formed by planar arrangement of coupling members 8 each connecting the upper end side ends of pairs of airflow straightening members 71 and 72 of multiple frame members 11. In this case also, in the same manner as in FIG. 2, the pair of airflow straightening members 71 and 72 of the frame member 11 are arranged so as to project downward from the ceiling 22a, and the airflow straightening component 7 includes the adjacent airflow straightening members 71 and 72 of the frame member 11, the airflow straightening member 71 and the airflow straightening member 72 being overlapped with each other in the thickness direction (travel direction Y). According to the propulsion control device 1 illustrated in FIG. 7 in this manner, the airflow straightening components 7 are arranged side-by-side and parallel to the longitudinal axis direction X; the airflow straightening components 7 include the airflow straightening members 71 and 72 arranged to protrude downward from the ceiling 22a, the airflow straightening members 71, 72 being overlapped with each other in the thickness direction of the airflow straightening components 7, multiple airflow straightening members 71 and 72 arranged protruding downward from the ceiling 22a; and the ceiling 22a is formed by planar arrangement of the coupling members 8 each connecting the mutually adjacent pair of airflow straightening members 71 and 72 with an interval therebetween; and air can thus be circulated more efficiently within the housing, and strength of the housing can be improved while reducing weight. Moreover, a structure may be adopted that does not include the pair of the airflow straightening members 71 and 72 of the frame member 11 at a location of the ceiling 22a where the airflow straightening component 7 is not arranged.

Figure 8:
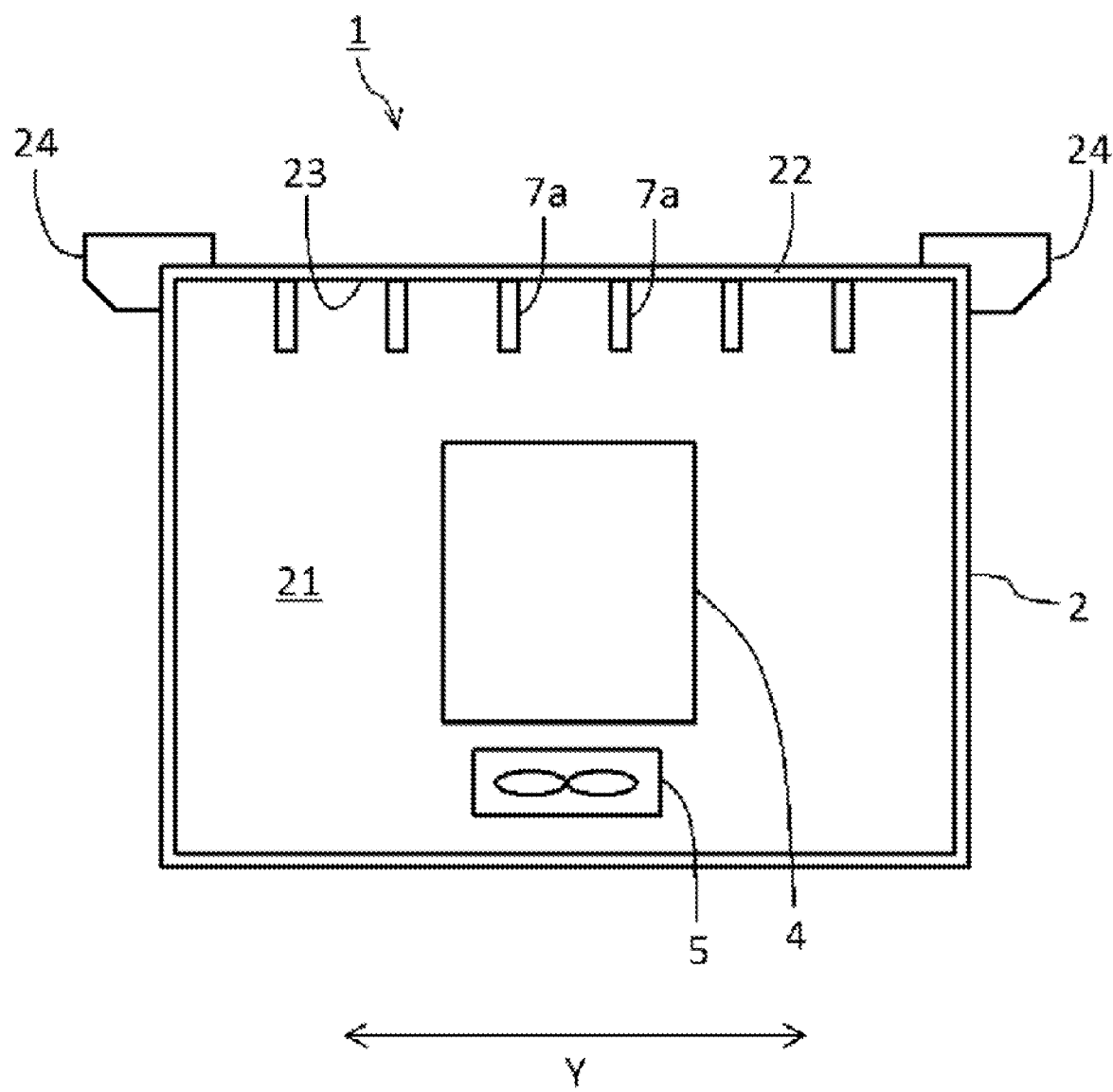
FIG. 8 is a cross-sectional view illustrating yet another example of configuration of the interior of the propulsion control device according to Embodiment 1 of the present disclosure.

Moreover, although in the propulsion control device 1 according to Embodiment 1 of the present disclosure, the airflow straightening component 7 includes the adjacent airflow straightening members 71 and 72 of the frame member 11, the airflow straightening member 71 and the airflow straightening member 72 being overlapped with each other in the thickness direction (travel direction Y), as illustrated in FIG. 8, plate-like airflow straightening components 7a elongated in the longitudinal axis direction X and protruding downward from the ceiling 22 may be arranged side-by-side and parallel to the longitudinal axis direction X to be disposed at the interior face 23 of the ceiling 22. Due to formation of the airflow straightening component 7a in this manner from a single plate-like component, a more simplified structure can be used to cause the air passed through the gate controller 4 and the airflow guide member 6 to flow further toward the other end side in the longitudinal axis direction X, and the air can be circulated within the housing 2.

Figure 9:
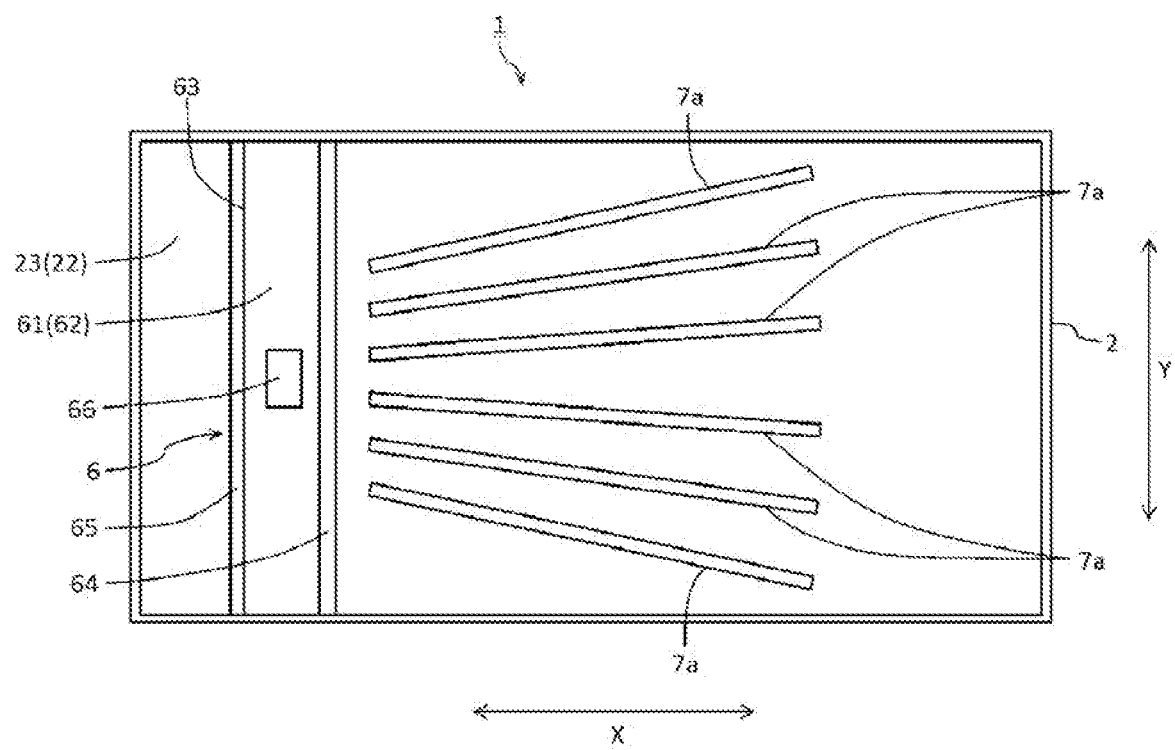
FIG. 9 is a cross-sectional view illustrating another example of configuration of the interior face of the ceiling of the housing of the propulsion control device according to Embodiment 1 of the present disclosure.

Moreover, without arranging the airflow straightening components 7a mutually parallel to each other in the longitudinal axis direction X, as illustrated in FIG. 9, the plate-like airflow straightening components 7a may be disposed at the interior face 23 of the ceiling 22 such that spacing between airflow straightening components 7a increases as the airflow straightening components are apart from the airflow guide member 6 (toward the other end side in the longitudinal axis direction X). Due to such arrangement, the air passed through the gate controller 4 and the airflow guide member 6 can be circulated more uniformly within the housing 2.

Figure 10:
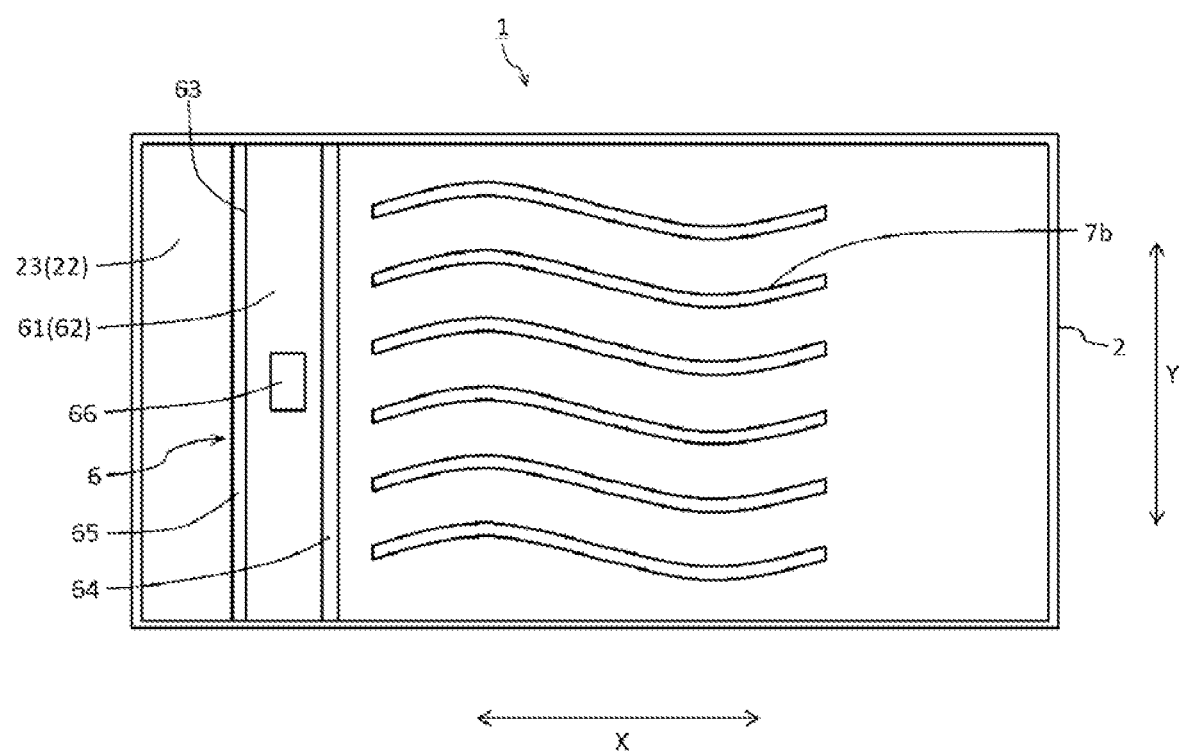
FIG. 10 is a cross-sectional view illustrating yet another example of configuration of the interior face of the ceiling of the housing of the propulsion control device according to Embodiment 1 of the present disclosure.

Moreover, although the airflow straightening components 7 and 7a each extending linearly in the longitudinal axis direction, as illustrated in FIG. 10, multiple airflow straightening components 7b having wave-like plate shapes may be arranged side-by-side in the longitudinal axis direction X to be disposed at the interior face 23 of the ceiling 22. Due to such configuration, the air passed through the gate controller 4 and the airflow guide member 6 can have increased surface area contact with the airflow straightening components 7b, and the cooling efficiency can thus be increased.

Embodiment 2

Figure 11:
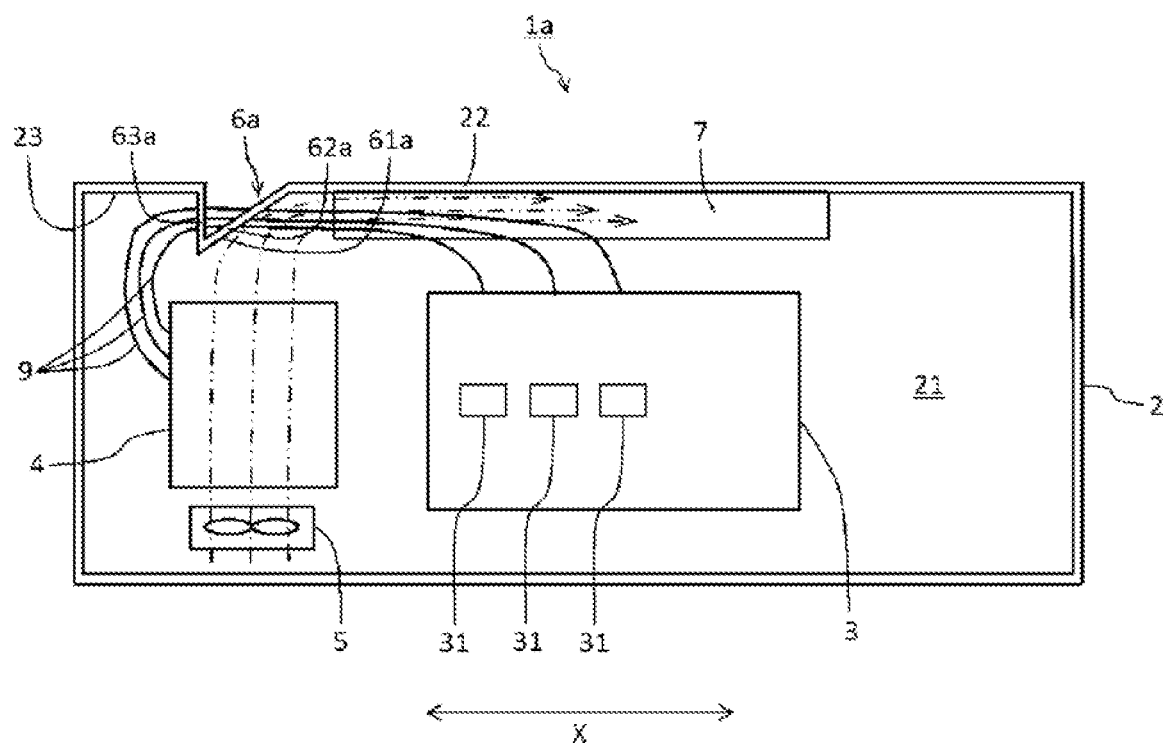
FIG. 11 is a cross-sectional view illustrating an example of configuration of an interior of a propulsion control device according to Embodiment 2 of the present disclosure.

Next, overall configuration of a propulsion control device 1a according to Embodiment 2 of the present disclosure is described with reference to FIG. 11. In the propulsion control device 1a according to Embodiment 2 of the present disclosure, as illustrated in FIG. 11, the airflow guide member 6a configured as the reinforcing beam is formed integrally with the ceiling 22. Moreover, configurations that are similar to those of the propulsion control device 1 according to Embodiment 1 of the present disclosure are assigned the same reference numeral, and detailed description of such configurations is omitted.

As illustrated in FIG. 11, by processing to bend the frame forming the ceiling 22, the airflow guide member 6a includes a plate-like first member 62a having the airflow guide face 61a, and a second member 63a extending toward the ceiling 22 and continuing from the end portion of the first member 62a, the end portion being opposite to the ceiling 22.

According to the propulsion control device 1a according to Embodiment 2 of the present disclosure, the airflow guide member 6a formed as the reinforcing beam is formed by processing to bend the ceiling 22, air passed through the gate controller 4 can be circulated in the interior of the housing 2 without an increase in the number of components, and strength of the housing 2 can be increased.

Embodiment 3

Figure 12:
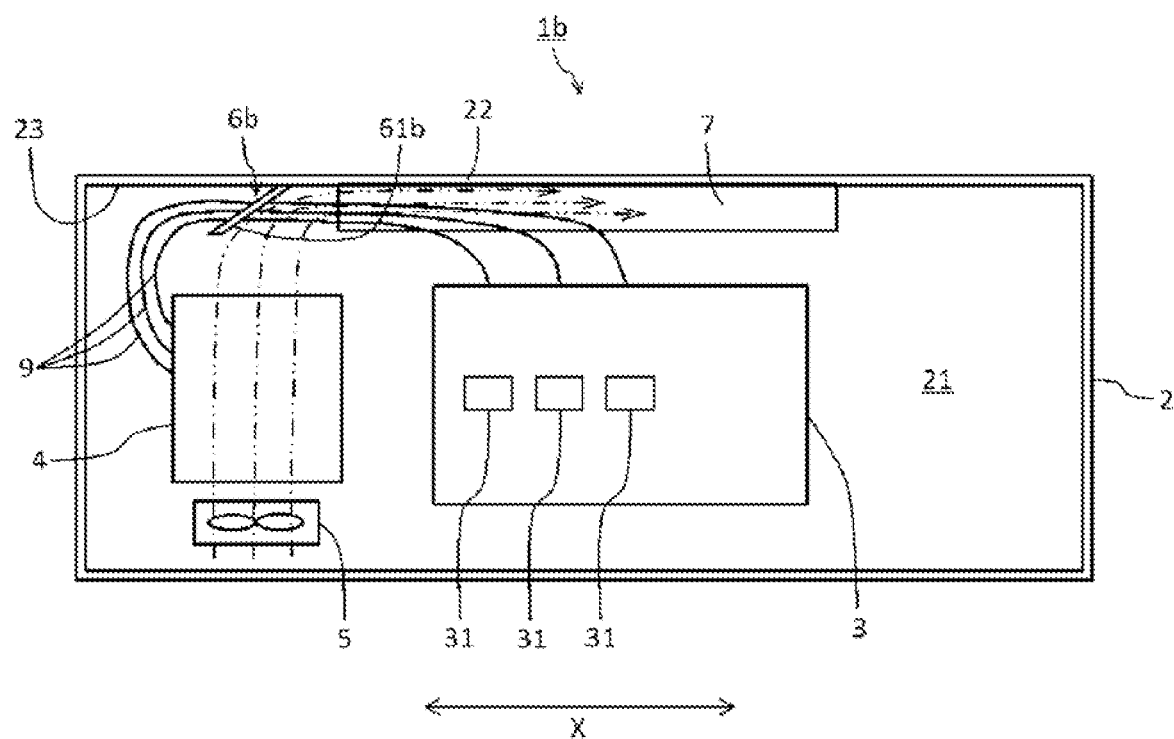
FIG. 12 is a cross-sectional view illustrating an example of configuration of an interior of a propulsion control device according to Embodiment 3 of the present disclosure.

Next, overall configuration of a propulsion control device 1b according to Embodiment 3 of the present disclosure is described with reference to FIG. 12. As illustrated in FIG. 12, in a propulsion control device 1b according to Embodiment 3 of the present disclosure, an airflow guide member 6b including plate-like component having airflow guide face 61b for causing the air passed through the gate controller 4 to flow toward the other end side in the longitudinal axis direction X of the interior space 21 of the housing 2 is fixed to the interior face 23 of the ceiling 22 of the housing 2. The airflow guide face 61b of the airflow guide member 6b is set at a predetermined angle relative to the vertical direction in a manner similar to the airflow guide faces 61 and 61a of the airflow guide members 6 and 6a. The predetermined angle of the airflow guide face 61b is set to an angle tilted such that the tip portion positioned to the side further apart from the ceiling 22 than the base-end portion positioned near the ceiling 22 is positioned at the one end side in the longitudinal axis direction X. Moreover, in the present embodiment, although an example is illustrated in which the end portion of the side abutting against the ceiling 22 of the airflow guide member 6b is directly fixed to the ceiling 22, the end portion of the side of the airflow guide member 6b abutting against the ceiling 22 may be formed by bending toward the one end side or the other end side in the longitudinal axis direction X, and a fixing part may be provided for fixing to the ceiling 22.

According to the propulsion control device 1b according to Embodiment 3 of the present disclosure, the airflow guide member 6b is configured from a plate-like component having the airflow guide face 61 that is set to an angle tilted such that the tip portion positioned closer to the side apart from the ceiling 22 than the base-end portion positioned to the side near the ceiling 22 is positioned at the one end side in the longitudinal axis direction X, and therefore, by a more simple configuration, the air passed through the gate controller 4 can be efficiently guided toward the other end side in the longitudinal axis direction X of the interior space 21 of the housing 2.

Embodiment 4

Figure 13:
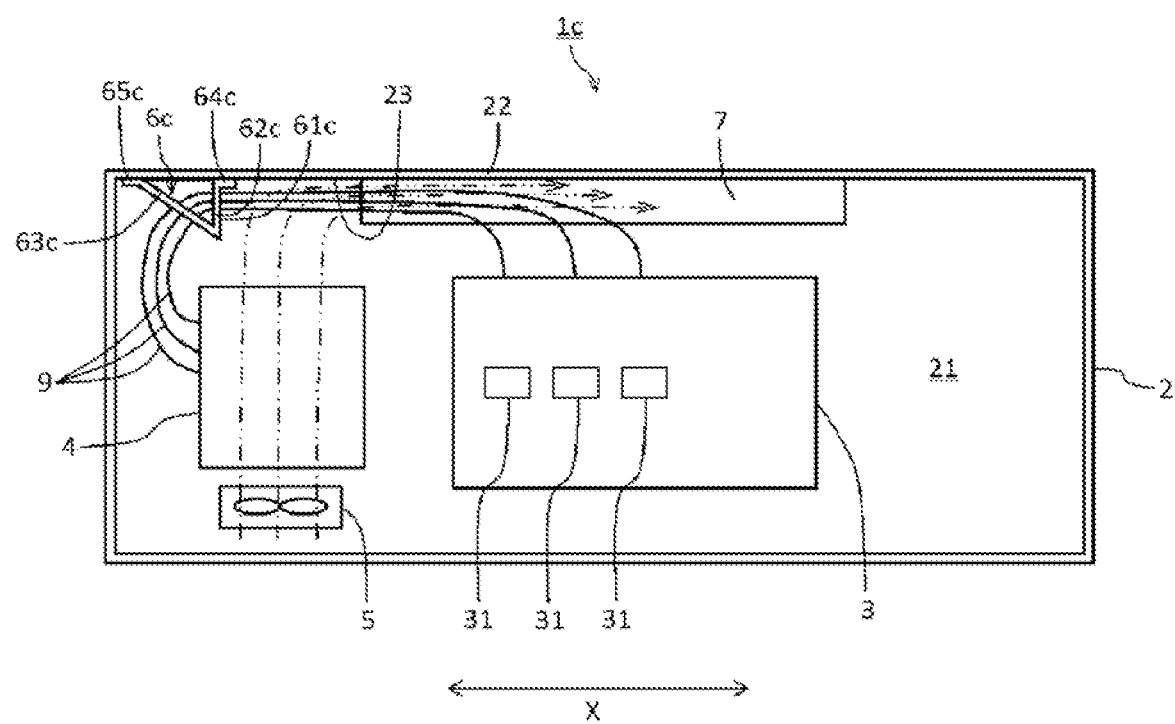
FIG. 13 is a cross-sectional view illustrating an example of configuration of an interior of a propulsion control device according to Embodiment 4 of the present disclosure.

Next, overall configuration of a propulsion control device 1c according to Embodiment 4 of the present disclosure is described with reference to FIG. 13. In the propulsion control device 1c according to Embodiment 4 of the present disclosure, as illustrated in FIG. 13, an airflow guide face 61c of the airflow guide member 6c is formed at an angle so as to be parallel to the vertical direction. Moreover, configurations that are similar to those of the propulsion control device 1 according to Embodiment 1 of the present disclosure are assigned the same reference numeral, and detailed description of such configurations is omitted.

As illustrated in FIG. 13, the airflow guide member 6c is formed as the reinforcing beam of the ceiling 22 including a plate-like first member 62c having the airflow guide face 61c, and a second member 63c extending toward the interior face of the ceiling 22 and continuing from the end portion of the first member 62c, the end portion being opposite to a side abutting against the ceiling 22.

At the end portion of the side of the first member 62c abutting against the ceiling 22, a first fixing part 64c is formed for fixing the airflow guide member 6c to the ceiling 22. The first fixing part 64c is formed by bending from the first member 62c toward the other end side in the longitudinal axis direction X from the end portion of the side connected to the ceiling 22, and although not illustrated in detail, is fixed to the ceiling 22 by means such as welding or fixing members such as bolts. Moreover, also at the end portion of the side of a second member 63c abutting against the ceiling 22, a second fixing part 65c is formed for fixing the airflow guide member 6c to the ceiling 22. The second fixing part 65c is formed by bending from the end portion of the side of the second member 63c abutting the ceiling 22 toward the one end side in the longitudinal axis direction X, and although not illustrated in detail, the second fixing part 65c fixed to the ceiling 22 by means such as welding or fixing members such as bolts. The airflow guide face 61c is formed at an angle so as to be parallel to the vertical direction. Moreover, the airflow guide face 61c is arranged so as to be positioned closer to the one end side in the longitudinal axis direction X than the position on the ceiling 22 corresponding to the fan 5.

The airflow guide face 61c of the propulsion control device 1c according to Embodiment 4 of the present disclosure is formed at an angle parallel to the vertical direction, and is arranged at a position closer to the one end side in the longitudinal axis direction X than the position on the ceiling 22 corresponding to the fan 5, and thus the inflow, toward the other end side in the longitudinal axis direction X, of the air passed through the gate controller 4 can be suppressed, and the air can be made to flow toward the other end side in the longitudinal axis direction X within the housing 2. Moreover, the airflow guide face 61c is angled parallel to the vertical direction, and thus the production process is simplified. Moreover, although the present embodiment illustrates an example in which the airflow guide member 6c is formed as the reinforcing beam, configuration may be further simplified by forming the airflow guide member by only a plate-like component having the airflow guide face 61c formed at the angle parallel to the vertical direction.

Embodiment 5

Figure 14:
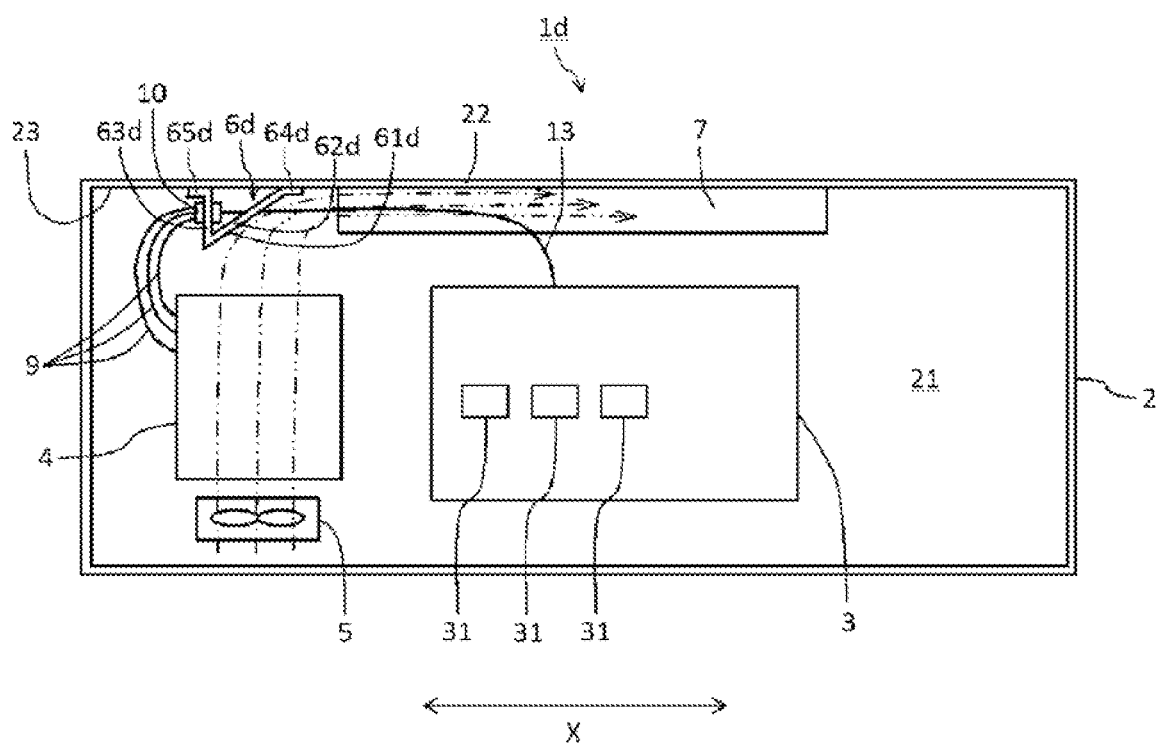
FIG. 14 is a cross-sectional view illustrating an example of configuration of an interior of a propulsion control device according to Embodiment 5 of the present disclosure.
Figure 15:
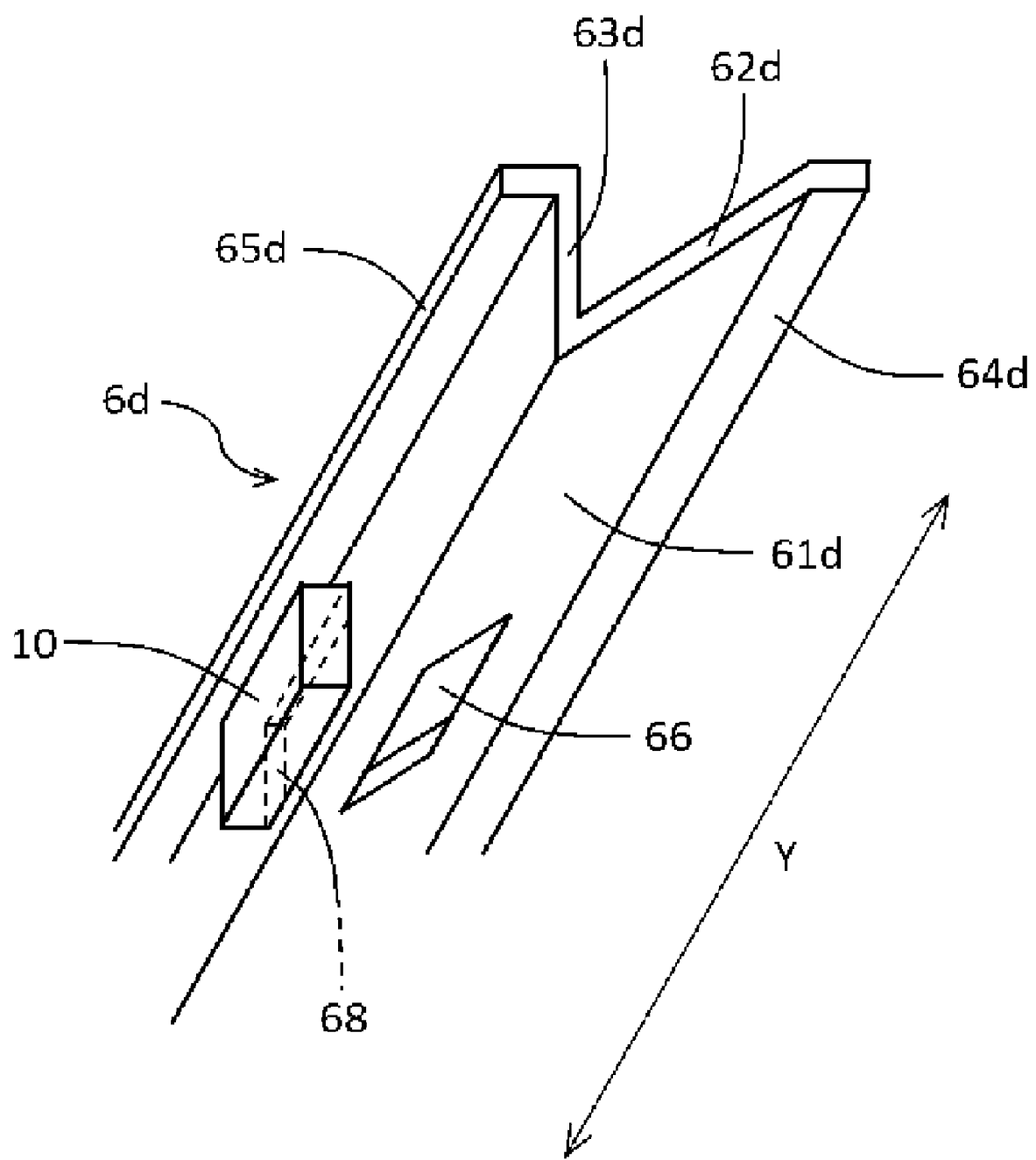
FIG. 15 is a perspective view illustrating an example of a state in which an interchange connector is installed in an airflow guide member that is a reinforcing beam.

Next, overall configuration of a propulsion control device 1d according to Embodiment 5 of the present disclosure is described with reference to FIGS. 14 and 15. In the propulsion control device 1d according to Embodiment 5 of the present disclosure, as illustrated in FIGS. 14 and 15, an interchange connector 10 is arranged in the airflow guide member 6d. Moreover, configurations that are similar to those of the propulsion control device 1 according to Embodiment 1 of the present disclosure are assigned the same reference sign, and detailed description of such configurations is omitted.

For the propulsion control device 1d, an example is illustrated of a configuration in which specifications of the multiple control boards (not illustrated) included in the gate controller 4, for example, are different from each other. In the case in which the specifications of the control boards included in the gate controller 4 are different from each other, the wires 9 led from the gate controller 4 also differ according to the specification corresponding to the respective control board. In the propulsion control device 1d, an interchange connector 10 is thus provided that has the function of connecting the wires 9 having different specifications and a wire 13 having a common specification and connected to the power converter 3 side.

As illustrated in FIGS. 14 and 15, the airflow guide member 6d of the propulsion control device 1d is formed as the reinforcing beam of the ceiling 22, the airflow guide member 6d including a plate-like first member 62d having an airflow guide face 61d and a second member 63d extending toward the interior face of the ceiling 22 and continuing from the end portion of the first member 62d, the end portion being opposite to a side abutting against the ceiling 22. As illustrated in FIG. 15, the airflow guide member 6d has a placement hole 68 for installation of the interchange connector 10 in the second member 63d. The interchange connector 10 is arranged in the placement hole 68 formed in the second member 63d, and is connected to the wires 9 having different specifications and disposed, from the gate controller 4 toward the airflow guide member 6d, toward the ceiling 22 side and led toward the side opposite to the direction where air, which is passed through the gate controller 4, is guided by the airflow guide member 6d. Moreover, the wire 13 led from the interchange connector 10 toward the other end side in the longitudinal axis direction X, passes through a support hole 66 formed in the first member 62d and connects to the power converter 3. Moreover, in the case of use of multiple wires 9 having a common specification, in contrast to the propulsion control device 1d according to the present embodiment, the interchange connector 10 may not be provided.

According to the propulsion control device 1d according to Embodiment 5 of the present disclosure, the airflow guide member 6d has the placement hole 68 in which the interchange connector 10 connected to the wires 9 is arranged, and thus providing of separate components or space is not required for arrangement of the interchange connector 10, and therefore space can be reduced, and interference of the wires 9 with the role of the airflow guide member 6d can be suppressed.

Although the foregoing discussion has presented specific embodiments, persons skilled in the art will recognize that changes may be made in form and detail without departing from the broader scope of the invention. This detailed description is not to be taken in a limiting sense, and the scope of the invention is defined only by the included claims, along with the full range of equivalents to which such claims are entitled.

REFERENCE SIGNS LIST

1 Propulsion control device
2 Housing
21 Space
22 Ceiling
23 Interior face
3 Power converter
4 Gate controller
5 Fan
6-6d Airflow guide member
61-61d Airflow guide face
611 Base-end portion
612 Tip portion
62 First member
63 Second member
66, 67 Support hole
68 Placement hole
7-7b Airflow straightening component
71,72 Airflow straightening member
8 Coupling member
9 Wire
10 Interchange connector

The invention claimed is:

1. A propulsion control device comprising:
a housing;
a gate controller disposed at one end side of an interior space of the housing in a longitudinal axis direction, the gate controller being configured to control a power converter;
a fan disposed under the gate controller, the fan being configured to feed air to the gate controller;
an airflow guide member positioned relative to the gate controller at a side opposite to that of the fan, arranged at an interior face of a ceiling of the housing, and having an airflow guide face having a predetermined angle with respect to a vertical direction, the airflow guide member being configured to guide air passed through the gate controller to flow in a direction of airflow toward another end side of the interior space of the housing in the longitudinal axis direction; and
a plurality of wires led, from the gate controller toward the airflow guide member, to the side opposite to the direction of airflow and toward a ceiling side, the air passed through the gate controller being guided by the airflow guide member, wherein
the airflow guide member is a reinforcing beam including (i) a first member having the airflow guide face, and (ii) a second member extending toward the interior face of the ceiling and continuing from an end portion of the first member, the end portion being opposite to a side abutting against the ceiling, and
the first member and the second member of the airflow guide member each has a support hole to support the wires with the wires inserted therethrough.

2. The propulsion control device according to claim 1, wherein
the airflow guide face has a base-end portion disposed near the ceiling, and a tip portion disposed at a side apart from the ceiling, and
the predetermined angle is an angle tilted, relative to the vertical direction, so that the tip portion is positioned closer to the one end side in the longitudinal axis direction than the base-end portion.

3. The propulsion control device according to claim 2, further comprising:
an airflow straightening component disposed at a position further to the other end side of the interior face of the ceiling in the longitudinal axis direction than the airflow guide member, the airflow straightening component being configured to guide air passed through the gate controller and the airflow guide member further toward the other end side in the longitudinal axis direction.

4. The propulsion control device according to claim 1, wherein
the predetermined angle is an angle parallel to the vertical direction, and
the airflow guide face is disposed at a position closer to the one end side in the longitudinal axis direction than a position on the ceiling corresponding to the fan is to the one end side in the longitudinal axis direction.

5. The propulsion control device according to claim 4, further comprising:
an airflow straightening component disposed at a position further to the other end side of the interior face of the ceiling in the longitudinal axis direction than the airflow guide member, the airflow straightening component being configured to guide air passed through the gate controller and the airflow guide member further toward the other end side in the longitudinal axis direction.

6. The propulsion control device according to claim 1, further comprising:
an airflow straightening component disposed at a position further to the other end side of the interior face of the ceiling in the longitudinal axis direction than the airflow guide member, the airflow straightening component being configured to guide air passed through the gate controller and the airflow guide member further toward the other end side in the longitudinal axis direction.

7. The propulsion control device according to claim 6, wherein
the airflow straightening component is a plurality of airflow straightening components, and
the airflow straightening components project downward from the ceiling.

8. The propulsion control device according to claim 7, wherein spacing between the airflow straightening components increases as the airflow straightening components are apart from the airflow guide member.

9. The propulsion control device according to claim 7, wherein the airflow straightening component has a wavelike shape.

10. The propulsion control device according to claim 6, wherein
the airflow straightening component is a plurality of airflow straightening components,
the airflow straightening components are disposed in parallel to the longitudinal axis direction and are formed by overlapping, in a thickness direction of the airflow straightening component, a plurality of airflow straightening members projecting downward from the ceiling, and
the ceiling is formed by planar arrangement of coupling members each interconnecting a pair of the airflow straightening members that adjoin each other with an interval.

11. The propulsion control device according to claim 10, wherein the adjacent airflow straightening members that form the airflow straightening components have tip portions, the tip portions being welded together by edge connection structure.

12. The propulsion control device according to claim 6, wherein
the airflow straightening component is a plurality of airflow straightening components,
the airflow straightening components are disposed in parallel to the longitudinal axis direction and are formed by overlapping, in a thickness direction of the airflow straightening component, a plurality of airflow straightening members projecting downward from the ceiling, and
coupling members each interconnecting a pair of the airflow straightening members that adjoin each other with an interval are fixed to the interior face of the ceiling.

13. A propulsion control device comprising:
a housing;
a gate controller disposed at one end side of an interior space of the housing in a longitudinal axis direction, the gate controller being configured to control a power converter;
a fan disposed under the gate controller, the fan being configured to feed air to the gate controller; and
an airflow guide member positioned relative to the gate controller at a side opposite to that of the fan, arranged at an interior face of a ceiling of the housing, and having an airflow guide face having a predetermined angle with respect to a vertical direction, the airflow guide member being configured to guide air passed through the gate controller to flow in a direction of airflow toward another end side of the interior space of the housing in the longitudinal axis direction; and
a plurality of wires led, from the gate controller toward the airflow guide member, to the side opposite to the direction of airflow and toward a ceiling side, the air passed through the gate controller being guided by the airflow guide member, wherein the airflow guide member has a placement hole in which an interchange connector to be connected to the wires is disposed.

14. The propulsion control device according to claim 13, wherein
the airflow guide member is a reinforcing beam including (i) a first member having the airflow guide face, and (ii) a second member extending toward the interior face of the ceiling and continuing from an end portion of the first member, the end portion being opposite to a side abutting against the ceiling.

* * * * *